United States Patent
Quiquempoix et al.

(10) Patent No.: US 9,054,733 B2
(45) Date of Patent: Jun. 9, 2015

(54) QUANTIZATION NOISE COUPLING DELTA SIGMA ADC WITH A DELAY IN THE MAIN DAC FEEDBACK

(71) Applicant: Microchip Technology Incorporated, Chandler, AZ (US)

(72) Inventors: Vincent Quiquempoix, Divonne les Bains (FR); Fabien Vaucher, Lausanne (CH)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/301,948

(22) Filed: Jun. 11, 2014

(65) Prior Publication Data
US 2014/0368365 A1 Dec. 18, 2014

Related U.S. Application Data (60) Provisional application No. 61/834,207, filed on Jun. 12, 2013.

(51) Int. Cl.
H03M 3/00 (2006.01)

(52) U.S. Cl.
CPC ............... *H03M 3/39* (2013.01); *H03M 3/496* (2013.01); *H03M 3/30* (2013.01); *H03M 3/368* (2013.01)

(58) Field of Classification Search
CPC .......... H03M 3/496; H03M 3/39; H03M 3/30
USPC .......................................... 341/144, 143, 155
See application file for complete search history.

(56) References Cited

U.S. PATENT DOCUMENTS

| | | | | |
|---|---|---|---|---|
| 4,772,871 | A | * | 9/1988 | Suzuki et al. ................. 341/155 |
| 7,102,558 | B2 | | 9/2006 | Deval ............................ 341/150 |
| 7,495,593 | B2 | * | 2/2009 | Wang ............................ 341/143 |
| 7,532,138 | B2 | * | 5/2009 | Akizuki et al. ............... 341/143 |
| 7,961,126 | B2 | | 6/2011 | Deval et al. ................... 341/131 |
| 8,171,335 | B2 | * | 5/2012 | Tsai .............................. 713/503 |
| 2005/0285763 | A1 | | 12/2005 | Nguyen et al. ................ 341/120 |

FOREIGN PATENT DOCUMENTS

WO 2012/100105 A1 7/2012 ............. H02M 3/00

OTHER PUBLICATIONS

Nguyen, Khiem et al., "A 105dB SNR Multibit ΣΔ ADC for Digital Audio Applications," IEEE 2001 Custom Integrated Circuits Conference, vol. 23, 4 pages, May 6, 2001.
Peña-Perez, Aldo et al., "A 88-dB DR, 84-dB SNDR Very Low-Power Single Op-Amp Third-Order ΣΔ Modulator," IEEE Journal of Solid-State Circuits, vol. 47, No. 9, 12 pages, Sep. 1, 2012.
International Search Report and Written Opinion, Application No. PCT/US2014/042069, 13 pages, Oct. 15, 2014.

* cited by examiner

*Primary Examiner* — Brian Young
(74) *Attorney, Agent, or Firm* — King & Spalding L.L.P.

(57) ABSTRACT

A delta-sigma modulator has a first summing point subtracting a first feedback signal from an input signal and forwarding a result to a transfer function, a second summing point adding an output signal from said transfer function to the input signal and subtracting a second feedback signal, a first integrator receiving an output signal from the second summing point, a quantizer receiving an output signal from the integrator and generating an output bitstream, and a digital-to-analog converter receiving the bitstream, wherein the first and second feedback signal are the output signal from said digital-to-analog converter delayed by a one sample delay.

20 Claims, 9 Drawing Sheets

FIGURE 1
(Prior Technology)

FIGURE 2 (Prior Technology)

QUANTIZATION NOISE COUPLING DELTA SIGMA ADC WITH A DELAY IN THE MAIN DAC FEEDBACK

RELATED PATENT APPLICATION

This application claims priority to commonly owned U.S. Provisional Patent Application No. 61/834,207; filed Jun. 12, 2013; and is hereby incorporated by reference herein for all purposes.

TECHNICAL FIELD

The present disclosure relates to delta sigma modulators, in particular to quantization noise coupling delta sigma ADC's.

BACKGROUND

Figure 1:
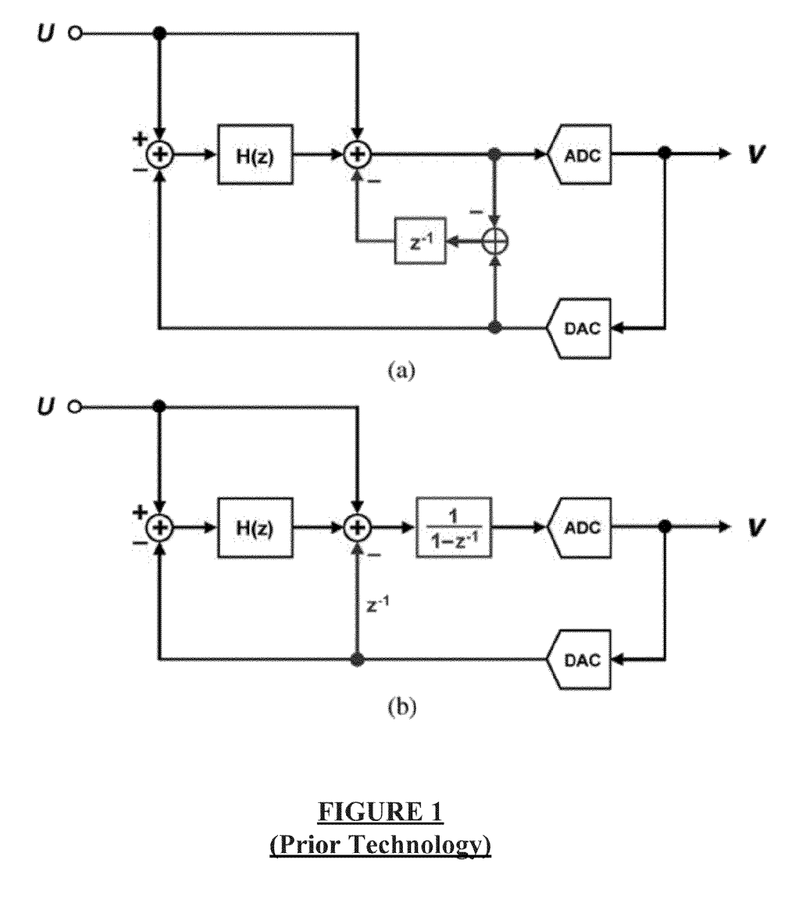
FIG. 1 illustrates a schematic block diagram of a conventional sigma delta ADC using QNC.

In the IEEE JSSC paper reference (K. Lee, M. R. Miller and G. C. Temes, "An 8.1 mW, 82 dB Delta-Sigma ADC with 1.9 MHz BW and −98 dB THD,", IEEE J. Solid State Circuits, vol. 44, no. 8, pp. 2202-2211, August 2009), a delta sigma analog-to-digital converter (ADC) with quantization noise coupling (QNC) is presented. The quantization noise coupling is a transposition on the analog domain of the truncation error feedback largely used in the digital domain. The idea is that the quantization noise error made by the quantizer of the ADC is memorized and fed back to the quantizer input so that this error is integrated in the next samples processing. FIG. 1 shows block diagrams of respective examples of how this can be done. For example, FIG. 1 shows that the difference between the analog sample and the actually converted digital sample is processed by subtracting the respective values and storing them for the next sample where this error is subtracted from the input value. This results in a transportation to the analog domain of the truncation error feedback used in digital filtering. Thus, the quantization error is stored in memory to not lose any information and to make sure that this information is properly integrated at the next sample. This furthermore implies a noise shaping of the quantization noise and therefore implies a better signal to quantization noise ratio (SNQR). This leads to a much better signal to quantization noise ratio because the error that is made by the quantizer is not lost at each sample, but is reintegrated to the signal to quantize at each sample. Table 1 shows the difference between a conventional sigma delta ADC and an improved sigma delta ADC using quantization noise coupling (QNC) depending on a selected oversampling rate (OSR).

TABLE 1

| | OSR (oversampling rate) | | | | | |
|---|---|---|---|---|---|---|
| | 16 | 32 | 64 | 128 | 256 | 512 |
| SNQR ($2^{nd}$ order single loop with 5 level DAC) | 59 dB | 74 dB | 89 dB | 102 dB | 112 dB | 128 dB |
| SNQR ($2^{nd}$ order single loop with 5 level DAC with QNC, same loop coefficients) | 64 dB | 81 dB | 96 dB | 112 dB | 126 dB | 140 dB |

The implementation of this quantization noise coupling is described in the aforementioned reference article and uses a feed forward summation amplifier (a feed forward summation amplifier is often used in delta-sigma ADC to provide low distortion transfer functions). By adding multiple capacitors in ping pong on the feedback of the amplifier and by adding phases to control these capacitors, the quantization error feedback is realized. This implementation needs additional capacitors and control phases and an additional digital-to-analog converter (DAC) with an additional delay for the signals at the input of this additional DAC (See Figure II of the reference article).

Figure 8:
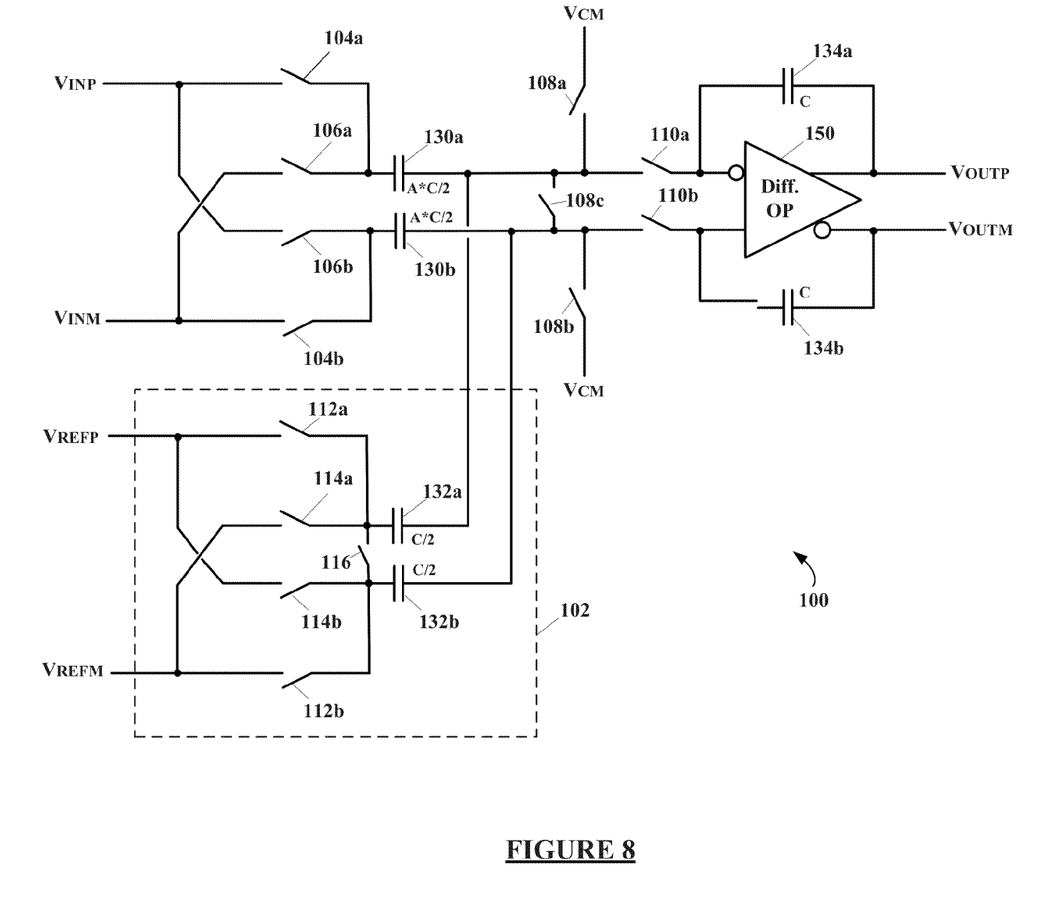
FIG. 8 shows a conventional 5-level DAC.
Figure 9A:
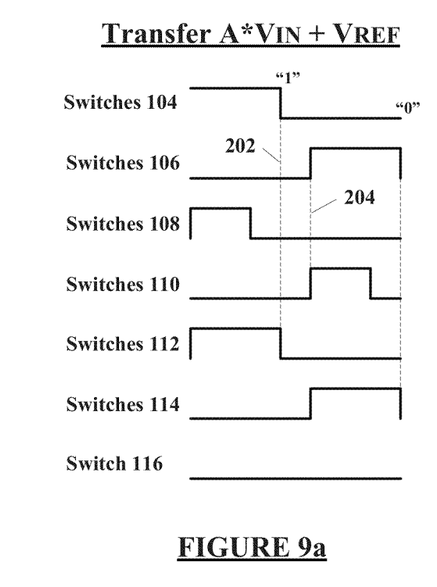
FIGS. 9a-e show possible switching sequences for the circuit shown in FIG. 8.
Figure 9B:
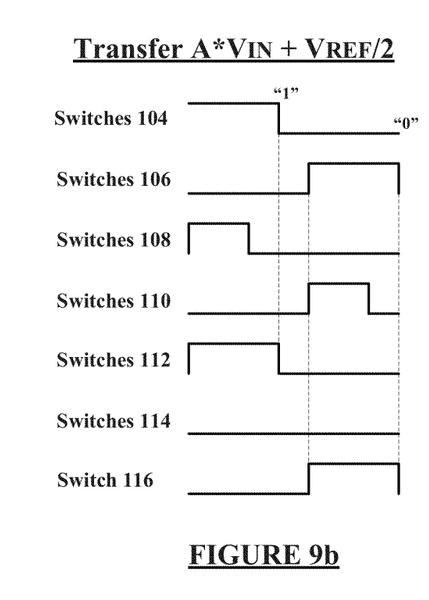
Figure 9C:
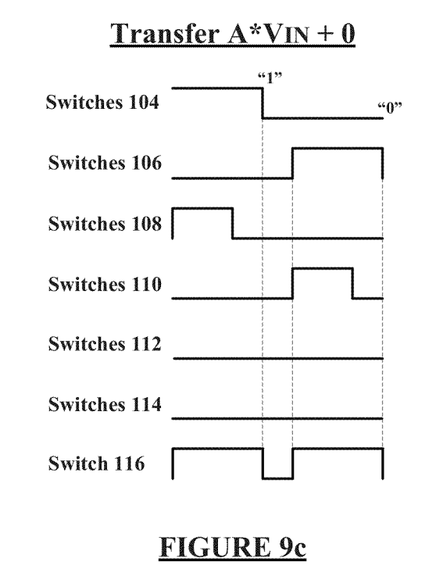
Figure 9D:
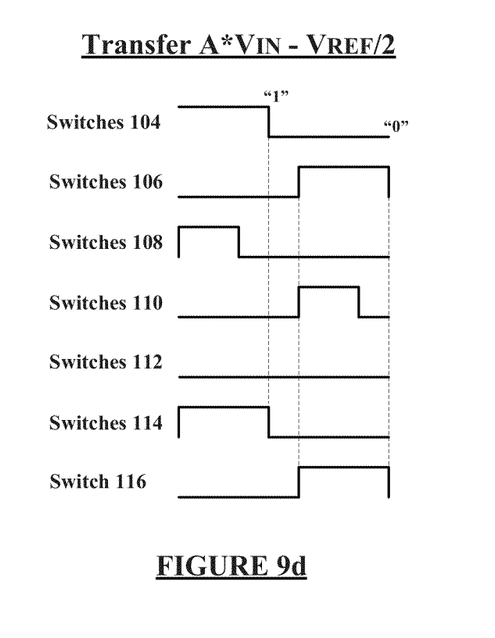
Figure 9E:
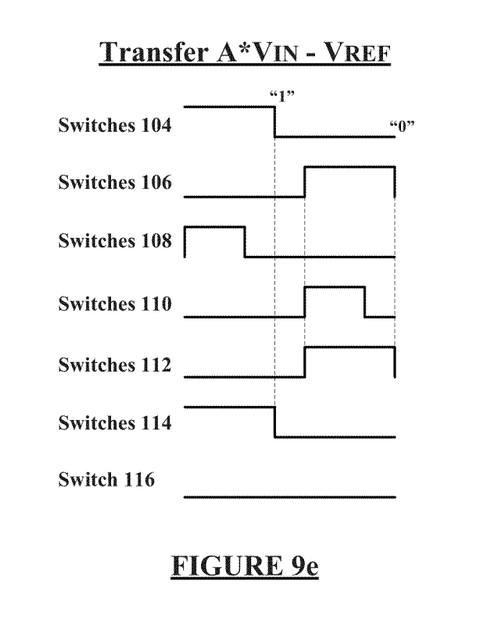

This implementation may be cumbersome and not adapted to a DAC implementation that requires two phases to process the DAC output (like the 5-level DAC described in commonly owned U.S. Pat. No. 7,102,558, which is hereby incorporated in its entirety by reference herein for all purposes). FIG. 8 shows a circuit diagram of the DAC related portion and integrator according to U.S. Pat. No. 7,102,558 which is capable of generating five different voltage levels. As shown in FIG. 8, depicted is a schematic circuit diagram of capacitor switching arrays and a differential amplifier for a five level feed-back digital-to-analog converter (DAC). The five-level feed-back DAC, generally represented by the numeral 100, comprises a switching sequence that generates five equally spaced charge quantities during two phases (precharge+transfer) of a differential charge transfer. Thus, the five equally distributed charge levels may be C*VREF, C*VREF/2, 0, −C*VREF/2 and −C*VREF. The reference voltage (VREF=VREFP−VREFM) charging circuit is generally represented by the numeral 102 and comprises transfer reference capacitors 132a and 132b, and switches 112, 114 and 116. The remainder of the specific exemplary embodiment comprises voltage input capacitors 130a and 130b, switches 104, 106, 108 and 110, and differential operational amplifier 150 having feedback sampling capacitors 134a and 134b. Switches 108a and 108b may relate to common mode operation, and switch 108c may relate to differential signal operation.

VREFP and VREFM represent voltages at the differential reference input terminals. The reference voltage VREF=VREFP−VREFM. VINP and VINM represent voltages at the differential input signal terminals. The input signal voltage VIN=VINP−VINM. The transfer reference capacitors 132a and 132b may be equal to C/2. The input sampling capacitors 130a and 130b may be equal to A*C/2. The feedback capacitors 134a and 134b may be equal to C. The input voltage is: VIN=VINP−VINM, and the output voltage is: VOUT=VOUTP−VOUTM. The gain of the circuit shown is A.

Switching sequences for these five levels are shown in FIGS. 9a-9e. The switching sequences of the switches 104-116 used to obtain the five equally distributed charge levels C*VREF, C*VREF/2, 0, −C*VREF/2 and −C*VREF of the specific exemplary circuit illustrated in FIG. 8. A "1" logic level depicts the respective switches in the closed position and a "0" logic level depicts the respective switches in the open position. FIGS. 9a-9e further illustrate the non-overlapping delays between the switches 104-116 in order to prevent a short between inputs and to ensure that the switches connected to the summing node always open first. The switches 104-116 are all open (off-logic 0) between time 202 and time 204. Time 202 signifies the end of the charging phase of the transfer reference capacitors 132a and 132b, and the sampled VIN charge on the input capacitors 130a and 130b. Time 204 signifies the beginning of the transfer phase of the charge on the transfer reference capacitors 132a and 132b.

Figure 2:
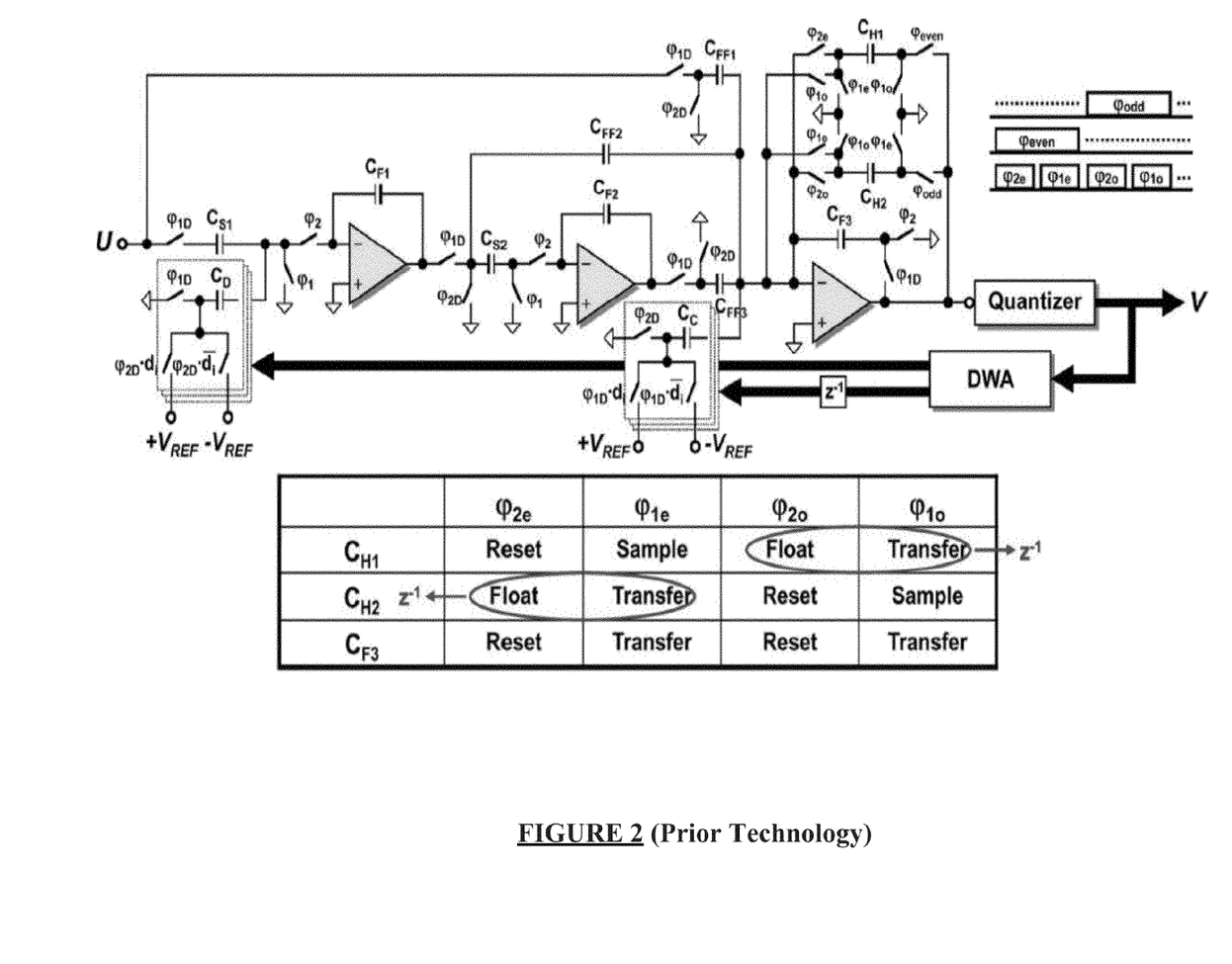
FIG. 2 illustrates an example of an implementation of a sigma delta ADC according to FIG. 1.

FIG. 2 shows a single ended implementation according to the above mentioned article for a better readability. However, the actual implementation would be fully differential. As can be seen, this implementation needs an additional digital-to-analog converter (DAC), additional delayed signals for the DAC input and a complex ping-pong feedback capacitor network in the summing amplifier which as mentioned is cumbersome to implement as it needs additional phases as well as many additional switches in the feedback of the operational amplifier. FIG. 2 shows that the phases are split between odd and even phases.

In this conventional embodiment as shown in the circuit diagram and associated table in FIG. 2, the quantization happens at the end of phase P1, the quantization feedback DAC samples in the next phase P1 and transfers in the next phase P2, with one sample delay, whereas the main DAC samples in phase P2 of the same sample and transfers in phase P1 of the next one, with no delay. Hence, this conventional concept requires a complex implementation which is undesirable.

SUMMARY

Therefore a need exists for a simpler implementation of the quantization noise coupling, at the expense of slightly modifying the signal transfer function of which the modification is very minor if a large oversampling ratio (OSR) is used in the Delta-Sigma ADC.

According to an embodiment, a delta-sigma modulator may comprise a first summing point subtracting a first feedback signal from an input signal and forwarding a result to a transfer function, a second summing point adding an output signal from the transfer function to the input signal and subtracting a second feedback signal, a first integrator receiving an output signal from the second summing point, a quantizer receiving an output signal from the integrator and generating an output bitstream, and a digital-to-analog converter receiving the bitstream, wherein the first and second feedback signal are the output signal from the digital-to-analog converter delayed by a one sample delay.

According to a further embodiment of the delta-sigma modulator, the delta-sigma modulator may operate with a charge phase and a transfer phase and quantization is performed in the transfer phase. According to a further embodiment of the delta-sigma modulator, the digital-to-analog converter (DAC) can be implemented by two charge-transfer DACs each configured to delay a generated analog feedback signal by one sample. According to a further embodiment of the delta-sigma modulator, the delta-sigma modulator can be oversampled. According to a further embodiment of the delta-sigma modulator, the delta-sigma modulator can be an n-th order, multi-loop or multi-bit modulator. According to a further embodiment of the delta-sigma modulator, the transfer function can be provided by a second integrator generating an output signal fed to a first amplifier to via a second amplifier to a third integrator, wherein the output signal of the third integrator is amplified by a third amplifier whose output signal is added to the output signal of the first amplifier. According to a further embodiment of the delta-sigma modulator, the quantizer can be a n-level multi-bit variable resolution quantizer. According to a further embodiment of the delta-sigma modulator, a charge phase may be non-overlapping with a following transfer phase. According to a further embodiment of the delta-sigma modulator, the delta-sigma modulator may further comprise a latch signal generated at the end of the transfer phase and used to latch a signal for the quantizer. According to a further embodiment of the delta-sigma modulator, a summing point can be implemented by a node connected with a first terminal of at least a first capacitor and a second capacitor, wherein the second terminals of the first and second capacitor receive charges to be added via respective switches. According to a further embodiment of the delta-sigma modulator, the digital-to-analog converter (DAC) can be a single voltage DAC followed by a one sample delay, wherein an output of the one-sample delay if coupled with the first and second summing point.

According to another embodiment, a method for operating a delta-sigma modulator may comprise: subtracting a first feedback signal from an input signal and forwarding a result to a transfer function, adding an output signal from the transfer function to the input signal and subtracting a second feedback signal and integrating a resulting output signal, quantizing the integrated signal and generating an output bitstream, and converting the bitstream into an analog signal and delaying the analog signal by a one sample delay to provide the first and second feedback signal.

According to a further embodiment of the method, the method can be performed with a charge phase and a transfer phase and quantization is performed in the transfer phase. According to a further embodiment of the method, a digital-to-analog conversion can be implemented by two charge-transfer digital-to-analog converters (DAC) each configured to delay a generated analog feedback signal by one sample. According to a further embodiment of the method, the delta-sigma modulator can be oversampled. According to a further embodiment of the method, the quantizer can be a n-level multi-bit variable resolution quantizer. According to a further embodiment of the method, the transfer function can be provided by a second integrator generating an output signal fed to a first amplifier to via a second amplifier to a third integrator, wherein the output signal of the third integrator is amplified by a third amplifier whose output signal is added to the output signal of the first amplifier. According to a further embodiment of the method, the step of quantizing can be performed by a n-level multi-bit variable resolution quantizer. According to a further embodiment of the method, a charge phase may be non-overlapping with a following transfer phase. According to a further embodiment of the method, the method may further comprise a latch signal generated at the end of the transfer phase and used to latch a signal for the quantizer. According to a further embodiment of the method, the step of adding may be implemented by a node connected with a first terminal of at least a first capacitor and a second capacitor, wherein the second terminals of the first and second capacitor receive charges to be added via respective switches. According to a further embodiment of the method, converting the bitstream may be performed by a single voltage DAC followed by a one sample delay, wherein an output of the one-sample delay if coupled with the first and second summing point.

BRIEF DESCRIPTION OF THE DRAWINGS

A more complete understanding of the present disclosure may be acquired by referring to the following description taken in conjunction with the accompanying drawings wherein.

DETAILED DESCRIPTION

Figure 3:
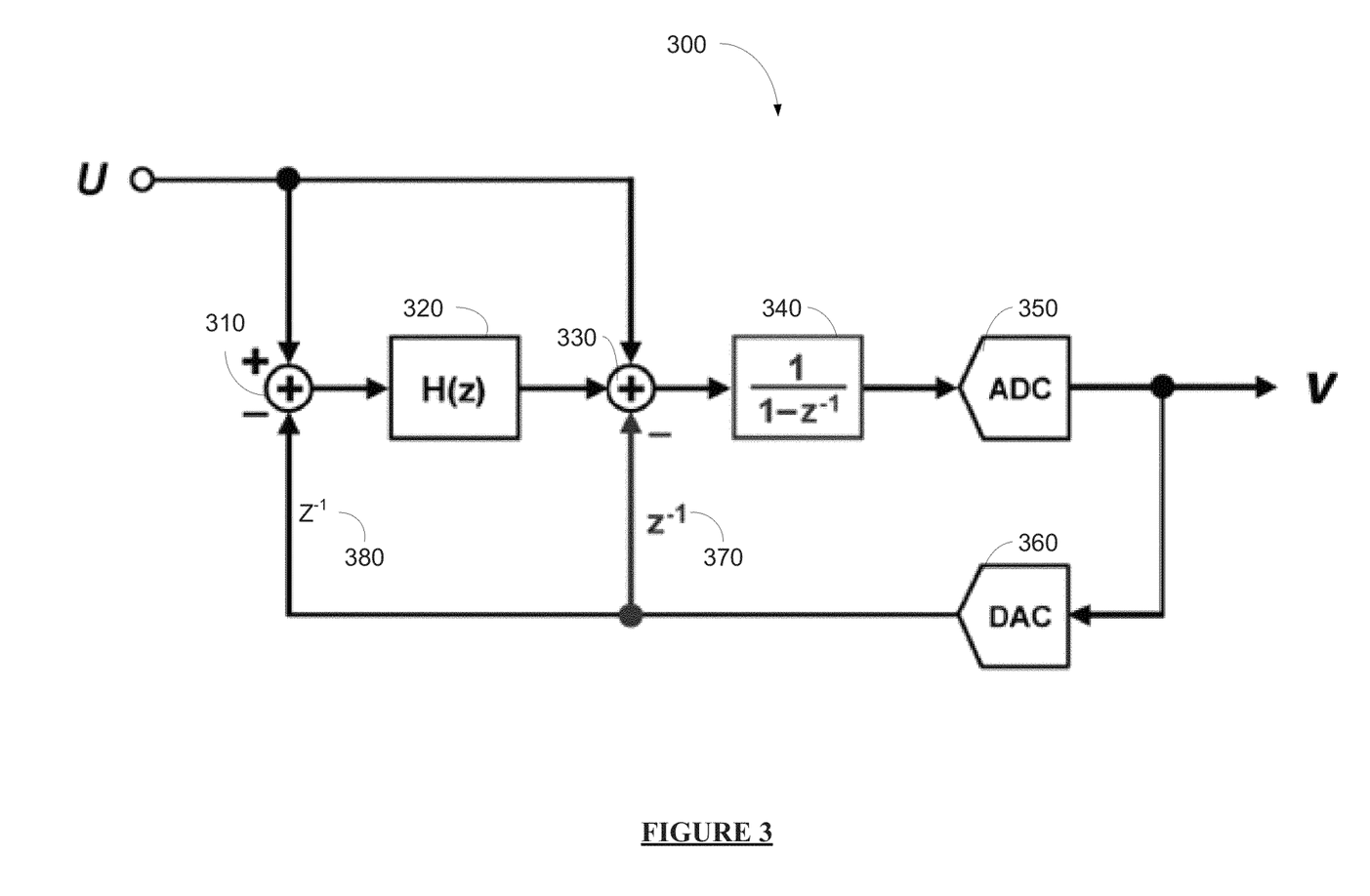
FIG. 3 illustrates a schematic block diagram of a delta-sigma ADC according to various embodiments of this disclosure.
Figure 4A:
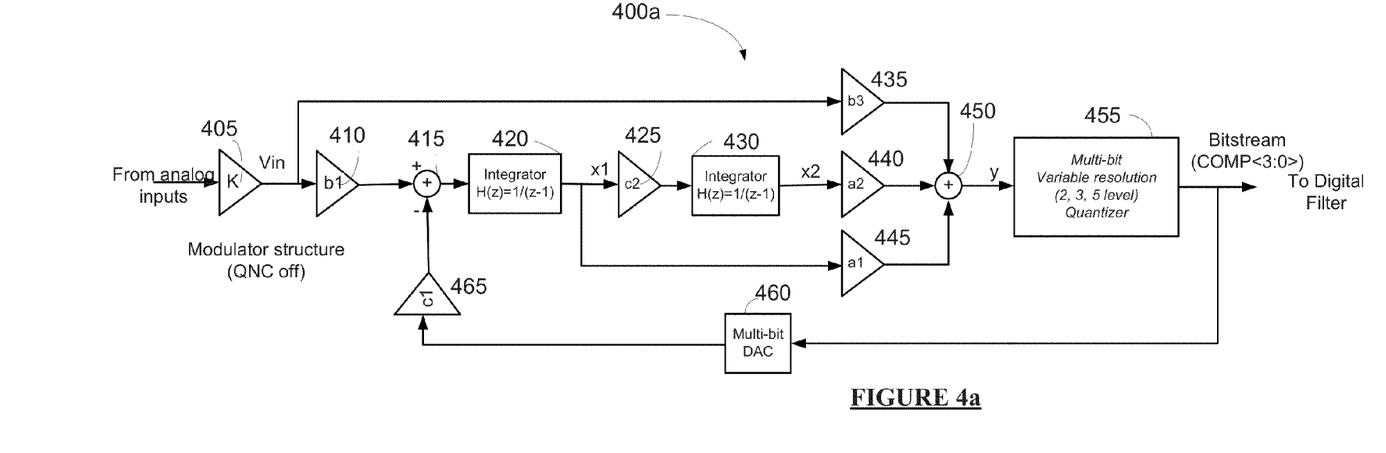
FIGS. 4a and b illustrates another schematic block diagram of a delta-sigma ADC according to various embodiments of this disclosure.
Figure 4B:
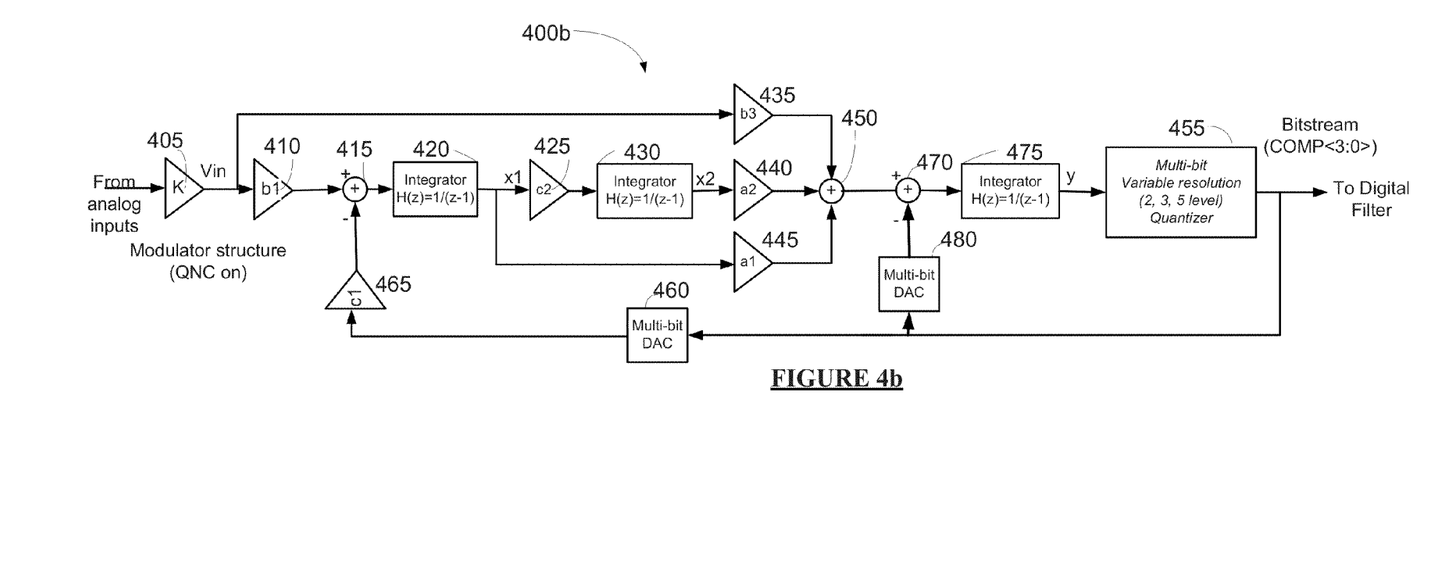

Referring now to the drawings, in particular FIGS. 3 and 4a and b, block diagrams of example embodiments are schematically illustrated. Like elements in the drawings will be represented by like numbers.

According to various embodiments, a delta-sigma ADC implementation can be provided using quantization noise coupling as shown in FIG. 3. The input signal is fed to a first and second summing point 310 and 330. The output of the first summing point 310 is forwarded to a transfer function 320 whose output is added to the input signal by the second summing point 330. The output of the second summing point 330 is integrated by integrator 340 whose output is fed to an analog-to-digital converter 350 (ADC). The ADC 350 provides the output bit stream which is fed back to digital-to-analog converter 360 (DAC). The output of DAC 360 is fed through a first delay element 370 with a negative sign (subtraction) to the second summing point 330 and a second delay element 380 with a negative sign (subtraction) to the first summing point 310.

The implementation is simplified by adding the second delay 380 in the main feedback DAC signal path. This delay 380 can be realized according to one embodiment by performing the quantization during the phase P2. Hence, the quantization happens at the end of P2 during the feed-forward (FF) phase, and by applying the DAC signals at the next phases P1 and P2. Contrary to this concept, in the article mentioned above, in a conventional system the quantization happens in phase P1 and the main DAC gives its output in phase P2, in other words the DAC samples in phase P2.

As shown in FIG. 3, only a single DAC 360 is necessary when the DACs generate a voltage. However, as most common, when charge transfer DACs are used, generally separate DACs for each path are necessary, one (main feedback DAC) for the first summing point 310 and one (quantization error feedback DAC) for the second summing point 330. FIGS. 4a and b show block diagrams of such an implementation using charge transfer DACs.

The FIGS. 4a and 4b are showing an embodiment of the implementation according to some embodiments in the case of a second order single loop modulator using a cascade of integrators in a feed forward (CIFF) topology. Many other topologies can be used for implementation and this disclosure is not limited by this exemplary embodiment. The quantizer is also not limited to any specific embodiment such as a 5-level quantizer.

As shown in the exemplary embodiment of FIGS. 4a, b, the analog input signal is fed through an amplifier/driver 405 having a coefficient K to a driver 410 having a coefficient b1 and an amplifier/driver 435 having a coefficient b3. The coefficients of the various amplifiers/drivers provide a factor by which an input signal is multiplied which can be greater, equal or smaller than 1. The output of driver 410 is forwarded to adder 415 whose output feds integrator 420. The output signal x1 of integrator 420 is forwarded to amplifier/driver 425 with coefficient c2 and amplifier/driver 445 with coefficient a1. The output of driver 425 is fed to integrator 430 whose output signal x2 is fed to amplifier/driver 440 having coefficient a2. The outputs of amplifiers/drivers 435, 440 and 445 are summed up by adder 450 whose output carrying signal y feeds a quantizer 455. The quantizer 455 can be implemented any way, for example but not limited to a multi-bit quantizer. In particular, as shown in FIGS. 4a and 4b, a multi-bit variable resolution quantizer can be used. Such a quantizer can provide for a variable resolution, for example 2, 3, or 5 different levels depending on a control signal. The control signal can, for example, be provided by a quasi-random sequence generator to provide automatic dithering as known from U.S. Pat. No. 7,961,126 assigned to Applicant and hereby incorporated by reference. However, other quantizer may be used according to various embodiments.

The output of quantizer 455 provides the bitstream which is then forwarded to the digital decimation filter (not shown). Furthermore, when the QNC is not activated, as shown in FIG. 4a, the signal is fed back to multi-bit DAC 460 whose output is connected with amplifier/driver 465 having coefficient c1 whose output signal is subtracted from the output signal of driver 410.

FIG. 4b shows the same structure with QNC activated. Now, the digital output signal of quantizer 455 if fed to quantization error feedback DAC 480 in addition to main feedback DAC 460. An additional summing point 470 is provided that receives the output signal from summing point 450 and the output signal of multi-bit DAC 480. The output signal of adder 470 is then integrated by integrator 475 which now produces output signal y that is again forwarded to quantizer 455.

This delay that has been added helps in such an implementation as shown in FIG. 4b because, the quantization error feedback DAC 480 can use the same exact inputs as the main feedback DAC 460, so no additional delay is needed between the two DACs that may be necessary otherwise. The other simplification is that the feed forward (FF) amplifier can be used in a very simple integrator stage configuration as shown for example in FIG. 5.

Figure 5:
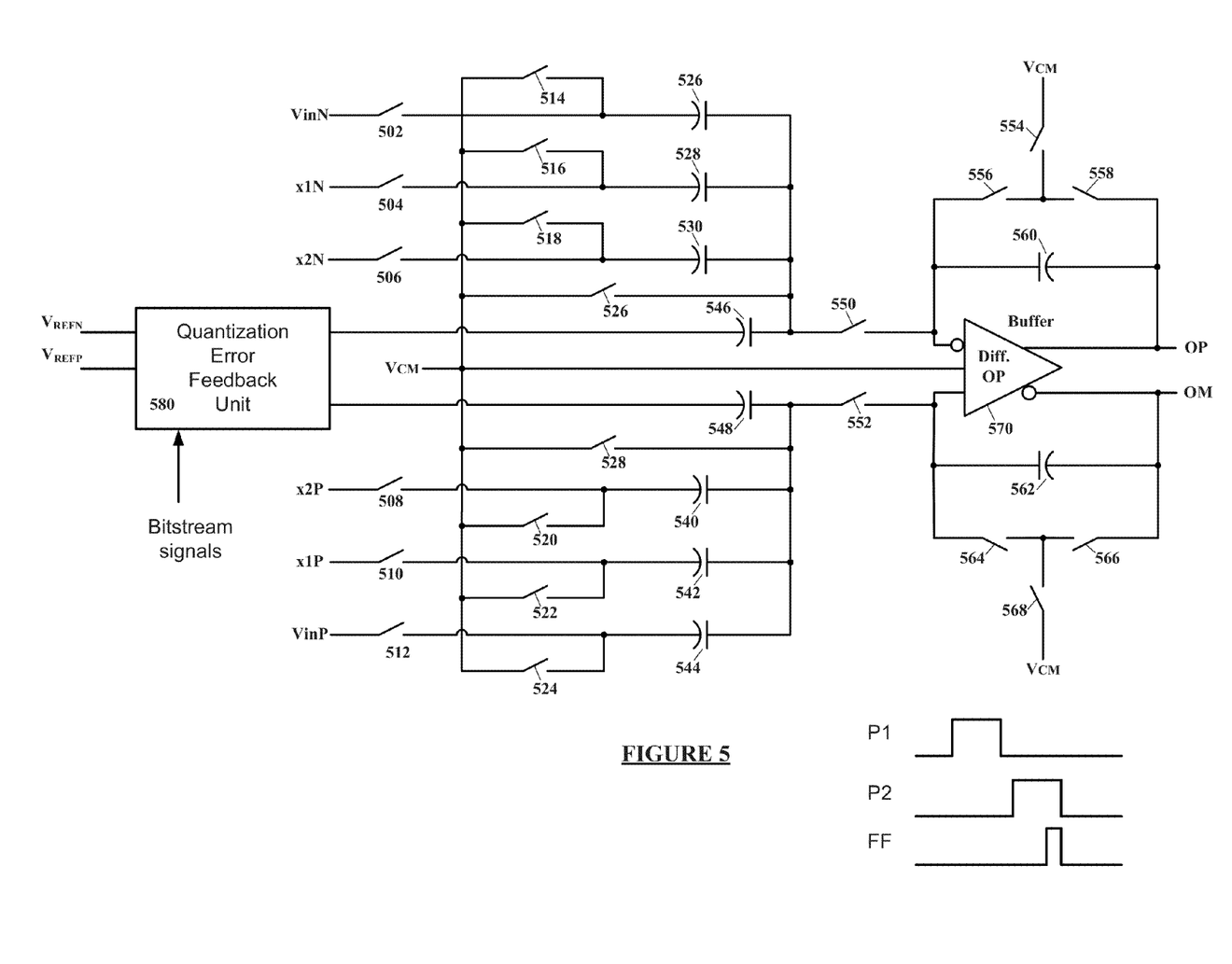
FIG. 5 illustrates an implementation with respect to the block diagram of FIG. 4b.

FIG. 5 represents the summing junction of all the feed forward (FF) paths in a differential implementation. The feed forward path include the outputs of drivers 435, 440 and 445 with coefficients b3, a2, and a1, here represented by the differential signals VinP, VinN, x1P, x1N, x2P, x2N. Capacitor 526 receives the signal VinN or the common mode signal VCM through switches 502 or 514, respectively. Similarly, capacitor 528, switches 504 and 516 are provided for signal x1N; capacitor 530, switches 506 and 518 for signal x2N; capacitor 540, switches 508 and 520 for signal x2P; capacitor 542, switches 510 and 522 for signal x1P; and capacitor 544, switches 512 and 524 for signal VinP. The summing point is represented by the nodes that connect capacitors 526, 528, 530, 546, 548, 540, 542, 544, respectively through switches 550 and 552 with the integrator.

The integrator 475 if implemented by opamp 570 and capacitors 560 and 562 and switches 554, 556, and 558 for the negative branch and switches 564, 566, and 568 for the positive branch. The second charge transfer multi bit DAC 480 is formed by the unit 580 which comprises a set of input switches for the DAC 480 and receiving the bitstream and reference voltages VREFP and VREFN and the sampling caps 546, 548 for the DAC 480. The implementation of unit 580 can be, for example, similar to the one shown with unit 102 in FIG. 8. Switches 526 and 528 may couple the summing nodes with the common mode voltage VCM.

The output OP, OM of the schematic shown in FIG. 5 is the node y as shown in the diagrams of FIG. 4b, which is then forwarded to the multi bit quantizer 455. The direct FF path in FIGS. 4a and 4b is the path where b3 represents the gain, which comes from the input of the Sigma delta modulator. The first integrator 420 output is x1 represented by the differential signal x1P, x1N, the second integrator 430 output is x2 represented by the differential signal x2P, x2N.

As mentioned above, this implementation uses two DACs 460 and 480, both receiving the same input and working synchronously. The two DACs 460 and 480 are needed because the DACs transfer charges at two different spots according to this specific implementation. However, other embodiments may only require a single voltage DAC.

The circuit shown in FIG. 5 is controlled by two phases P1 and P2 as typical for a charge transfer system. In the lower right of FIG. 5 the exemplary control signals P1, P2, and FF are shown. The following table shows which signal P1 or P2 controls which switch, wherein P1d and P2d represent switching signals that correspond to signals P1 and P2, but are slightly delayed to avoid charge injection issues. FF is the latch phase for the quantizer (which is not shown in FIG. 5) and happens at the end of P2. Furthermore, respective reset signals "reset" control the switches 554 and 568 in the operational amplifier feedback path and the switches 556, 558, 564, 568 with the reset logic inverted signal "reset_n" as known in the art. As mentioned above, the output is sampled by the quantizer ADC in P2 and not in P1, thus, quantization happens in P2. P1 is the hold phase for the integrator. It holds the memory of the previous sample, thus, it holds the quantization error and DAC feedback. P2 transfers the new sample data. After quantization in the FF phase, the DAC input is latched. During the next P1 the DAC, which for example can be a 5-level DAC as disclosed in U.S. Pat. No. 7,102,558, e.g. also shown in FIG. 8 with reference numeral 102, samples the reference voltage VrefP, VrefN or common mode voltage VCM=0, and in the next P2 the DAC resamples another reference voltage or 0 and transfers the difference of the two phases on the feedback capacitors 560, 562. Common mode voltage may not be equal to 0 according to some embodiments, but gives a zero charge transfer differentially. It shorts both caps on the N and P side. This induces a delay of one sample in the processing of the DAC input. The QNC is performed without modifying anything in the DAC and with a simple integrator stage. No coefficient in the loop has to be modified.

The reset switches, if enabled during P1 can also easily disable the integrator configuration and erase the memory between each sample. This combined with a constant 0 input on the DAC (that can be easily implemented in combinatorial logic at the DAC digital input) can completely disable the QNC configuration and easily enable toggling between QNC on and QNC off implementations if required (for example toggling between FIGS. 4a and 4b).

TABLE 2

| Switch | Control Signal |
| --- | --- |
| 502, 504, 506, 508, 510, 512 | P2d |
| 514, 516, 518, 520, 522, 524, | P1d |
| 526, 528 | P1 |
| 550, 552 | P2 |
| 556, 558, 564, 566 | reset_n |
| 554, 568 | reset |

According to another embodiment, if the VCM signal is replaced by x1P for switch 516, by x1N for switch 522, by x2P for switch 518, by x2P for switch 520, by VinM for switch 524, by VinP for switch 514, then a double sampling can be realized in each branch, resulting in a possible improvement of the signal to noise ratio for the feed forward block. The double sampling scheme can also reduce the capacitors by a factor of two. This is applicable here since the block is an integrator stage and it can include all the known improvements in integrator stages such as double sampling to improve its signal to noise ratio.

There is no more the need of additional feedback capacitors and complex ping pong configuration. There is only one simple feedback capacitor (capacitors 560, 562) and a standard integrator stage 475 where sampling is done in phase P1 and transfer to the feedback capacitors 560, 562 is done in phase P2 as will become evident with the exemplary implementation shown in FIG. 5. This is made possible as mentioned above because the quantization is done during phase P2. In phase P2, the quantization is performed, which gives the input of the two DACs (the main feedback DAC 460 and the quantization error DAC 480). At the next phase P1, a new input signal is sampled by the feed forward summer 470 (in an integrator configuration) and the DAC gives its first output in the same P1 phase. In phase P2, the DAC gives its second output (it needs two phases to process the input) and at the same time, the input is transferred to the feedback capacitor 560, 562. The DAC has naturally a delay of one sample due to the way it is processed here (it has an input latched at the end of P2 and it takes the next P1 and P2 to process the input which gives a one sample delay). So naturally here, the necessary delay needed for the truncation/quantization error feedback is realized without adding additional capacitors and phases which leads to a much more simple architecture while keeping the benefit of the quantization noise coupling.

This simpler implementation can be used as long as a feed forward (FF) path is present in the system, to allow the feed forward summer to be in a simple integrator configuration, and requires the quantization to be done at the end of phase P2. It is very useful because it is compatible with charge transfer DACs that have two phases sampling and transferring. The small drawback is that it adds a delay compared to the reference article in the main DAC feedback and thus it modifies the transfer function. However, for large enough oversampling rates (OSR), or small enough bandwidths, this modification can be neglected (if the added delay is small, or if the sample frequency is large compared to the bandwidth of interest which is usually the case in an oversampling converter) and gives very minor perturbation of the output spectrum (in the order of less than 0.01 dB in the current implementation with a second order single loop modulator with an OSR of 256).

Figure 6:
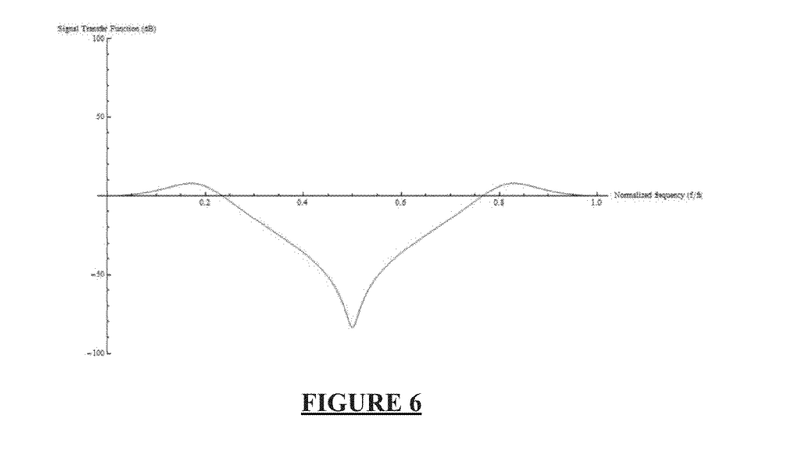
FIG. 6 shows the transfer function of a sigma delta ADC using QNC according to various embodiments of this disclosure.
Figure 7:
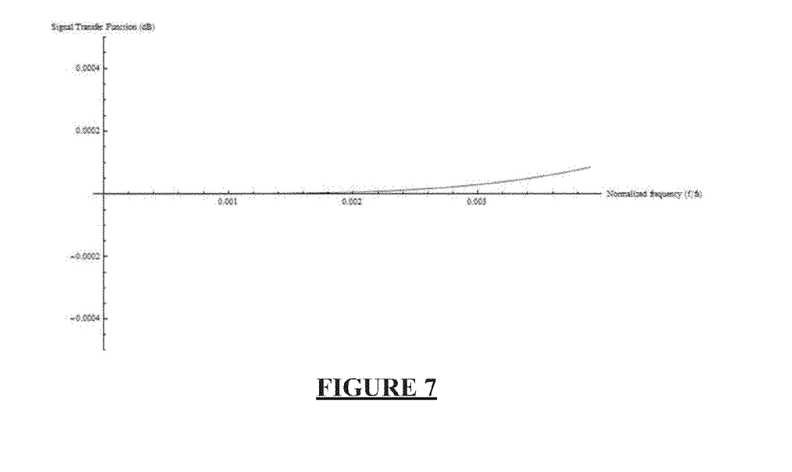
FIG. 7 shows a transfer function zoom of the bandwidth of interest.

FIG. 6 shows the signal transfer function for a sigma delta ADC as shown in FIGS. 3 and 4b with QNC implementation for a typical $2^{nd}$ order single loop modulator. The single transfer function=1 in the classical case. FIG. 7 shows the transfer function zoom, bandwidth of interest for OSR=256, the deviation is less than 0.0002 dB.

In summary, a better SNQR can be achieved for delta-sigma modulators without adding significant circuitry. For example, according to one embodiment only an additional DAC and its switches are required and no active circuitry. Furthermore, the implementation is simplified compared to conventional delta-sigma modulators.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A delta-sigma modulator comprising:
   a first summing point subtracting a first feedback signal from an input signal and forwarding a result to a transfer function;
   a second summing point adding an output signal from said transfer function to said input signal and subtracting a second feedback signal;
   a first integrator receiving an output signal from said second summing point;
   a quantizer receiving an output signal from said integrator and generating an output bitstream;
   a digital-to-analog converter receiving said bitstream, wherein the first and second feedback signal are the output signal from said digital-to-analog converter delayed by a one sample delay,
   wherein the delta-sigma modulator operates with a charge phase and a transfer phase and quantization is performed in the transfer phase.

2. The delta-sigma modulator according to claim 1, wherein the digital-to-analog converter (DAC) is implemented by two charge-transfer DACs each configured to delay a generated analog feedback signal by one sample.

3. The delta-sigma modulator according to claim 1, wherein the delta-sigma modulator is oversampled.

4. The delta-sigma modulator according to claim 1, wherein the delta-sigma modulator is an n-th order, multi-loop or multi-bit modulator.

5. An n-th order, multi-loop or multi-bit delta-sigma modulator comprising:
   a first summing point subtracting a first feedback signal from an input signal and forwarding a result to a transfer function;
   a second summing point adding an output signal from said transfer function to said input signal and subtracting a second feedback signal;
   a first integrator receiving an output signal from said second summing point;
   a quantizer receiving an output signal from said integrator and generating an output bitstream;
   a digital-to-analog converter receiving said bitstream, wherein the first and second feedback signal are the output signal from said digital-to-analog converter delayed by a one sample delay,
   wherein the transfer function is provided by a second integrator generating an output signal fed to a first amplifier to via a second amplifier to a third integrator, wherein the output signal of the third integrator is amplified by a third amplifier whose output signal is added to the output signal of the first amplifier.

6. The delta-sigma modulator according to claim 1, wherein the quantizer is a n-level multi-bit variable resolution quantizer.

7. The delta-sigma modulator according to claim 2, wherein a charge phase is non-overlapping with a following transfer phase.

8. The delta-sigma modulator according to claim 7, further comprising a latch signal generated at the end of the transfer phase and used to latch a signal for the quantizer.

9. The delta-sigma modulator according to claim 4, wherein a summing point is implemented by a node connected with a first terminal of at least a first capacitor and a second capacitor, wherein the second terminals of the first and second capacitor receive charges to be added via respective switches.

10. A delta-sigma modulator comprising:
    a first summing point subtracting a first feedback signal from an input signal and forwarding a result to a transfer function;
    a second summing point adding an output signal from said transfer function to said input signal and subtracting a second feedback signal;
    a first integrator receiving an output signal from said second summing point;
    a quantizer receiving an output signal from said integrator and generating an output bitstream;
    a digital-to-analog converter receiving said bitstream, wherein the first and second feedback signal are the output signal from said digital-to-analog converter delayed by a one sample delay,
    wherein the digital-to-analog converter (DAC) is a single voltage DAC followed by a one sample delay, wherein an output of the one-sample delay if coupled with the first and second summing point.

11. A method for operating a delta-sigma modulator comprising:
    subtracting a first feedback signal from an input signal and forwarding a result to a transfer function;
    adding an output signal from said transfer function to said input signal and subtracting a second feedback signal and integrating a resulting output signal;
    quantizing the integrated signal and generating an output bitstream;
    converting said bitstream into an analog signal and delaying the analog signal by a one sample delay to provide the first and second feedback signal,
    wherein the method is performed with a charge phase and a transfer phase and quantization is performed in the transfer phase.

12. The method according to claim 11, wherein a digital-to-analog conversion is implemented by two charge-transfer digital-to-analog converters (DAC) each configured to delay a generated analog feedback signal by one sample.

13. The method according to claim 11, wherein the delta-sigma modulator is oversampled.

14. The method according to claim 12, wherein the quantizer is a n-level multi-bit variable resolution quantizer.

15. The method according to claim 14, wherein the transfer function is provided by a second integrator generating an output signal fed to a first amplifier to via a second amplifier to a third integrator, wherein the output signal of the third integrator is amplified by a third amplifier whose output signal is added to the output signal of the first amplifier.

16. The method according to claim 11, wherein the step of quantizing is performed by a n-level multi-bit variable resolution quantizer.

17. The method according to claim 12, wherein a charge phase is non-overlapping with a following transfer phase.

18. The method according to claim 17, further comprising a latch signal generated at the end of the transfer phase and used to latch a signal for the quantizer.

19. The method according to claim 15, wherein the step of adding is implemented by a node connected with a first terminal of at least a first capacitor and a second capacitor, wherein the second terminals of the first and second capacitor receive charges to be added via respective switches.

20. The method according to claim 11, wherein converting said bitstream is performed by a single voltage DAC followed by a one sample delay, wherein an output of the one-sample delay if coupled with the first and second summing point.

* * * * *